(12) United States Patent
Deeney et al.

(10) Patent No.: US 7,434,309 B2
(45) Date of Patent: *Oct. 14, 2008

(54) METHOD AND APPARATUS FOR SUPPORTING A CIRCUIT COMPONENT HAVING SOLDER COLUMN INTERCONNECTS USING AN EXTERNAL SUPPORT

(75) Inventors: Jeffrey L. Deeney, Fort Collins, CO (US); Joseph D. Dutson, Loveland, CO (US); Richard J. Luebs, Windsor, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 777 days.

This patent is subject to a terminal disclaimer.

(21) Appl. No.: 10/652,598

(22) Filed: Aug. 29, 2003

(65) Prior Publication Data

US 2004/0035606 A1    Feb. 26, 2004

Related U.S. Application Data

(63) Continuation of application No. 09/994,004, filed on Nov. 16, 2001, now Pat. No. 6,710,264.

(51) Int. Cl.
H05K 3/36    (2006.01)

(52) U.S. Cl. .................................. 29/840; 174/260

(58) Field of Classification Search .......... 174/260; 257/784; 29/840; 361/758, 783, 796, 807–812
See application file for complete search history.

(56) References Cited

U.S. PATENT DOCUMENTS

| | | |
|---|---|---|
| 4,164,003 A | 8/1979 | Cutchaw |
| 4,545,610 A | 10/1985 | Lakritz |
| 4,581,680 A | 4/1986 | Garner |
| 4,866,571 A | 9/1989 | Butt |
| 5,222,014 A | 6/1993 | Lin |
| 5,239,198 A | 8/1993 | Lin et al. |
| 5,244,143 A | 9/1993 | Ference |
| 5,541,450 A | 7/1996 | Jones et al. |
| 5,557,503 A | 9/1996 | Isaacs |
| 5,615,735 A | 4/1997 | Yoshida |
| 5,639,696 A * | 6/1997 | Liang et al. ............ 228/180.22 |
| 5,648,679 A * | 7/1997 | Chillara et al. .............. 257/666 |
| 5,790,378 A * | 8/1998 | Chillara ...................... 361/719 |

(Continued)

OTHER PUBLICATIONS

Thomas P. Dolbear et al., Effect of Mechanical Shock and Vibration on the Second-level Temperature Cycling Reliability of Ceramic Ball Grid Arrays with a Continuous Compressive Load Applied, 5 unnumbered pages.

R. Bargerhuff et al., Development of a Large Heatsink Support Structure, 12 unnumbered pages.

Thomas J. Augustin et al., patent application filed on Nov. 16, 2001 titled Method And Apparatus For Shock And Vibration Isolation Of A Circuit Component, U.S. Appl. No. 09/990,819, filed Nov. 16, 2001.

(Continued)

*Primary Examiner*—Jeremy C Norris

(57) ABSTRACT

A circuit board assembly having a circuit board and a column grid array ("CGA") integrated circuit package. The CGA package has a substrate having an array of solder columns extending from a bottom surface. A frame surrounds the CGA integrated circuit package and is affixed thereto. The frame extends from the substrate to a portion of the circuit board when the column grid array integrated circuit package is mounted on the circuit board to support the column grid array integrated circuit package. The frame is affixed to the CGA integrated circuit package by adhesive after the CGA integrated circuit package is mounted on the circuit board, the adhesive accommodating any variations in height of the CGA integrated circuit package.

2 Claims, 2 Drawing Sheets

U.S. PATENT DOCUMENTS

| | | | |
|---|---|---|---|
| 5,805,427 A | | 9/1998 | Hoffman |
| 5,833,471 A | * | 11/1998 | Selna .......................... 439/73 |
| 5,834,335 A | * | 11/1998 | Buschbom ................. 438/107 |
| 5,838,064 A | * | 11/1998 | Shimada et al. ............. 257/718 |
| 5,905,636 A | | 5/1999 | Baska et al. |
| 5,907,474 A | * | 5/1999 | Dolbear ...................... 361/705 |
| 5,926,370 A | | 7/1999 | Cromwell |
| 5,956,576 A | | 9/1999 | Toy et al. |
| 5,978,229 A | * | 11/1999 | Kim .......................... 361/760 |
| 5,990,418 A | | 11/1999 | Bivona et al. |
| 6,049,124 A | * | 4/2000 | Raiser et al. ................ 257/712 |
| 6,061,235 A | | 5/2000 | Cromwell |
| 6,084,178 A | | 7/2000 | Cromwell |
| 6,091,603 A | | 7/2000 | Daves et al. |
| 6,093,972 A | * | 7/2000 | Carney et al. .............. 257/790 |
| 6,112,976 A | * | 9/2000 | Achard et al. ............... 228/254 |
| 6,198,630 B1 | | 3/2001 | Cromwell |
| 6,231,333 B1 | | 5/2001 | Gruber |
| 6,235,996 B1 | | 5/2001 | Farooq |
| 6,245,186 B1 | * | 6/2001 | Alcoe et al. ................. 156/300 |
| 6,262,513 B1 | * | 7/2001 | Furukawa et al. ....... 310/313 R |
| 6,276,596 B1 | | 8/2001 | Gruber |
| 6,292,369 B1 | | 9/2001 | Daves et al. |
| 6,395,991 B1 | | 5/2002 | Dockerty et al. |
| 6,499,215 B1 | * | 12/2002 | Hoffmeyer et al. ............ 29/840 |
| 6,646,356 B1 | * | 11/2003 | Whalen et al. .............. 257/784 |
| 6,680,217 B2 | * | 1/2004 | Whalen et al. .............. 438/106 |
| 6,710,264 B2 | * | 3/2004 | Deeney et al. .............. 174/260 |

OTHER PUBLICATIONS

Jeffrey L. Deeney et al, patent application filed on Nov. 16, 2001 titled Method And Apparatus Of Supporting Circuit Component Having A Solder Column Array Using Interspersed Rigid Columns, U.S. Appl. No. 09/991,430, filed Nov. 16, 2001.

Jeffrey L. Deeney, patent application filed on Nov. 16, 2001 titled Method And Apparatus For Supporting Circuit Component Having Solder Column Array Interconnects Using Interposed Support Shims, U.S. Appl. No. 09/992,864, filed Nov. 16, 2001.

* cited by examiner

METHOD AND APPARATUS FOR SUPPORTING A CIRCUIT COMPONENT HAVING SOLDER COLUMN INTERCONNECTS USING AN EXTERNAL SUPPORT

CROSS REFERENCE TO RELATED APPLICATION(S)

This is a continuation of application Ser. No. 09/994,004 filed on Nov. 11, 2001 now U.S. Pat. No. 6,710,264 which is hereby incorporated by reference herein.

FIELD OF THE INVENTION

This invention relates to circuit components mounted on circuit boards by solder column interconnects or arrays, and more particularly, the support of circuit components having column grid arrays.

BACKGROUND OF THE INVENTION

Solder column interconnects or arrays are used to interconnect circuit packages to circuit boards, most typically large ceramic integrated circuit packages. One such package is the column grid array (CGA) integrated circuit package that has a ceramic substrate with an array of solder columns that extend out from it, typically from the bottom surface. The solder columns are attached at one end to connection pads or locations on the ceramic substrate. The solder columns are sufficiently tall so that when the circuit package is placed on a circuit board, the solder columns can accommodate the difference in thermal expansion between the ceramic integrated circuit package and the printed circuit board. The solder columns are soldered to respective pads on the circuit board using known techniques, such as a convection reflow solder process.

One problem with solder column arrays is that the solder columns do not withstand compressive force well. The solder columns in the solder column arrays are typically made of a 90%/10% Pb/Sn solder, making them soft. Moreover, the individual solder columns are very thin. Consequently, if any significant amount of compressive force is applied to the circuit package, such as might be applied by a cooling solution such as a heat sink or fan, the resulting weight on the circuit package may cause the solder column array to compress, particularly over time, which may compromise reliability. In this regard, loads in excess of about 10 to 20 grams per column exert sufficient compressive force so that reliability may be compromised. Since CGA integrated circuit packages are being increasingly used for high power integrated circuits, the cooling solution required often has considerable mass. It is not unusual for the heat sink or cooling solution used with such high power integrated circuits to exceed one pound.

SUMMARY OF THE INVENTION

In accordance with an aspect of the invention, a circuit board assembly has a circuit board and an integrated circuit package having a substrate with an array of solder columns extending from a bottom surface of the substrate to the circuit board when the integrated circuit package is mounted on the circuit board. At least one support member is affixed to at least one of a side of the substrate and a top surface of the substrate when the integrated circuit package is mounted to the circuit board. In an aspect of the invention, each support member is affixed by adhesive after the integrated circuit package is mounted to the circuit board, the adhesive accommodating any variation in height of the integrated circuit package. The support member or members support the integrated circuit package against compressive force.

In an aspect of the invention, the integrated circuit package is a CGA integrated circuit package.

In an aspect of the invention, the support member is a frame that surrounds the integrated circuit package and is affixed thereto. At least a portion of the frame extends from the substrate to a portion of a circuit board assembly when the column grid array integrated circuit package is mounted on the circuit board. The frame supports the column grid array integrated circuit package against compressive force.

In an aspect of the invention, the frame includes flanges that extend over a top surface of the substrate and that are affixed to at least one of the top surface of the substrate and an outer perimeter of a lid of the integrated circuit package.

In an aspect of the invention, the frame is affixed to at least one of an outer perimeter of the substrate and the outer edge of the lid.

In an alternative aspect of the invention, support legs support the substrate and have a flange that is affixed to at least one of the top surface of the substrate and an outer perimeter of the lid of the integrated circuit package.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings wherein.

DETAILED DESCRIPTION

The following detailed description is merely exemplary in nature and is in no way intended to limit the invention, its application, or uses.

Figure 1:
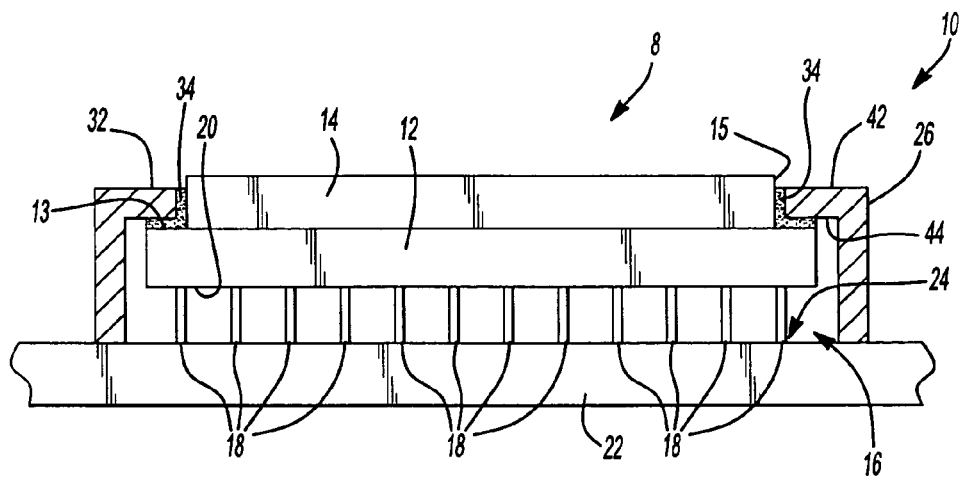
FIG. 1 a side view of a column grid array integrated circuit package mounted on a circuit board and having a support frame in accordance with the invention.

Referring to FIG. 1, a circuit board assembly 8 including a CGA integrated circuit package 10 and circuit board 22 in accordance with the invention is shown. It should be understood that while the invention is described with regard to a CGA integrated circuit package, it is not limited to CGA integrated circuit packages and can be utilized on any circuit package having solder column interconnects. CGA integrated circuit package 10 can be a CPU package but can also be other types of circuit packages, such as ASICs (application specific integrated circuits).

CGA integrated circuit package 10 has a substrate 12, usually made of ceramic, and a package lid 14. A solder column array 16 having an array of solder columns 18 extends from a bottom side 20 of substrate 12. When CGA integrated circuit package 10 is mounted on circuit board 22, solder columns 18 of solder column array 16 are soldered to respective connection pads 24 on circuit board 22, which is illustratively a printed circuit board.

A frame 26 is attached to CGA integrated circuit package 10, illustratively, by adhesive 34 disposed between frame 26 and CGA integrated circuit package 10. Frame 26 is made of material that is sufficiently rigid to support CGA integrated circuit package 10 against compressive force, such as is imposed by a cooling solution mounted to CGA integrated circuit package 10. For example, frame 26 can be made of metal or plastic. Adhesive 34 can be any adhesive suitable for bonding the material of which frame 26 is made to CGA integrated circuit package 10. For example, if frame 26 is made of stainless steel, then an epoxy adhesive could be used, such as 3M DP460 available from Minnesota Mining and Manufacturing, St. Paul, Minn. Illustratively, adhesives such as Loctite 3526 available from Loctite Corporation, Rocky Hills, Conn., or a single part thermoset epoxy such as Ablestik Laboratories 84.3, available from Ablestik Laboratories, Rancho Dominguez, Calif. could also be used.

Figure 2:
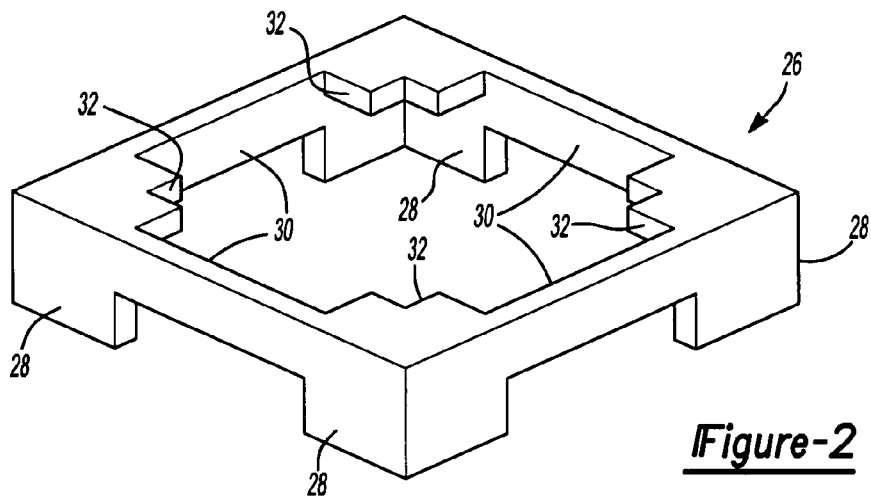
FIG. 2 is a perspective view of the support frame of FIG. 1.

Turning to FIG. 2, frame 26 is described in more detail. Frame 26 illustratively conforms to the shape of CGA integrated circuit package 10. In the embodiment shown in FIGS. 1 and 2, CGA integrated circuit package 10 is generally square so frame 26 is also generally square. Frame 26 has legs 28 at each corner with span sections 30 extending between adjacent legs 28. A flange 32 extends inwardly from a top of each leg 28. In the embodiment shown in FIG. 2, each leg 28 has first and second segments at right angles to each other as does flange 32. Each leg 28 extends beneath a plane in which bottom side 20 of substrate 12 lies and contacts a portion of circuit board 22 so that frame 26 supports CGA integrated circuit package 10 against compressive force, such as exerted by a cooling solution mounted on CGA integrated circuit package 10. While each leg 28 would typically contact the surface of circuit board 22, it should be understood that support structures could be provided on circuit board 22 for the legs 28 to contact.

Frame 26 surrounds CGA integrated circuit package 10 with flanges 32 extending over a top surface 13 of substrate 12 so that inner edges 42 of flange 32 are adjacent an outer perimeter 15 of package lid 14 of CGA integrated circuit package 10. Frame 26 is secured to CGA integrated circuit package 10 by adhesive disposed between a bottom surface 44 of flange 32 and top surface 13 of CGA integrated circuit package 10 and/or between inner edges 42 of flange 32 and outer perimeter 15 of package lid 14.

Figure 3:
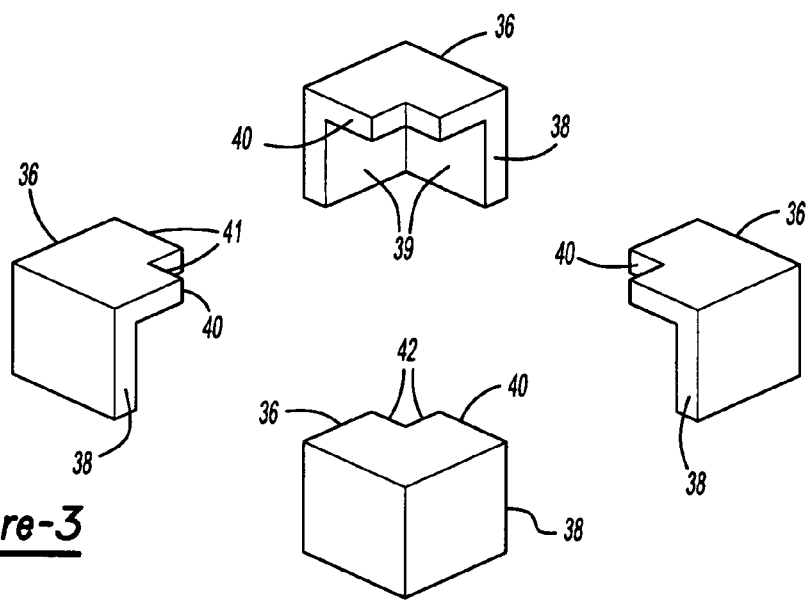
FIG. 3 is a perspective view of support legs in accordance with the invention.

Turning to FIG. 3, a variation of the invention shown in FIGS. 1 and 2 is shown. In FIG. 3, support sections or legs 36 are used in lieu of frame 26 to support CGA integrated circuit package 10. Support sections 36 are illustratively corner sections. Each corner section has a leg section 38, illustratively comprising first and second sections 39 at right angles to each other, and an inwardly extending top flange 40, illustratively having flange sections 41 at right angles to each other. Inner edges 42 and bottom surface 44 of top flanges 40 are secured to CGA integrated circuit package 10, such as by adhesive 34.

Figure 4:
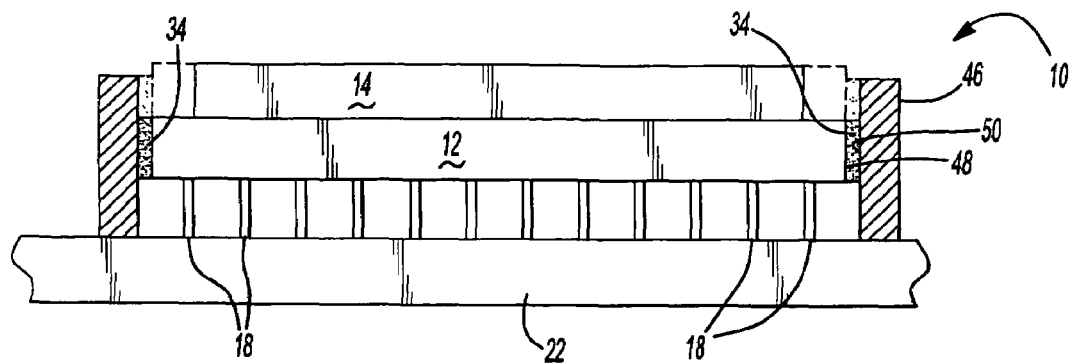
FIG. 4 is a side view of an alternative embodiment of a column grid array integrated circuit package mounted on a circuit board and having a support frame in accordance with the invention.
Figure 5:
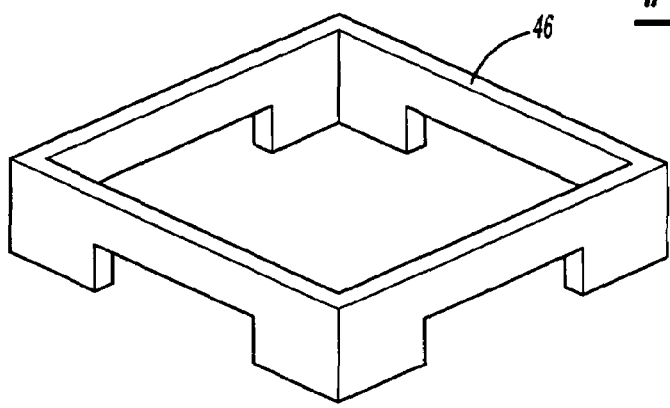
FIG. 5 is a perspective view of the support frame of FIG. 4.

Turning to FIGS. 4 and 5, a variation of the invention shown in FIGS. 1 and 2 is shown. In FIG. 4, a frame 46 is provided that is identical to frame 26 with the omission of top flanges 32. Frame 46 is secured to CGA integrated circuit package 10, such as by adhesive 34 disposed between sides 48 of CGA integrated circuit package 10 and inner sides 50 of frame 46. As shown in phantom in FIG. 4, lid 14 can extend to the edges of substrate 12 and also be secured to frame 46, such as by adhesive 34.

Figure 6:
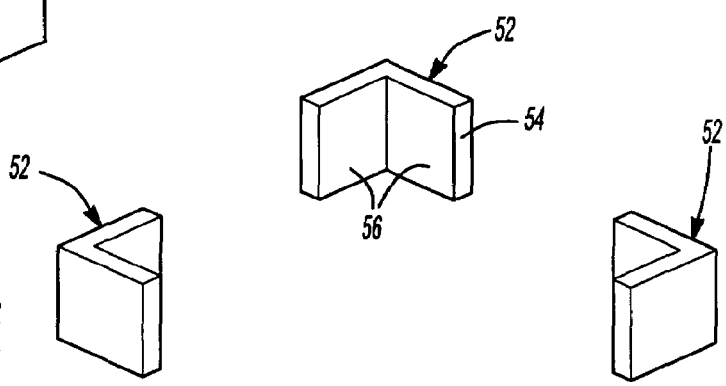
FIG. 6 is a perspective view of an alternative embodiment of support legs in accordance with the invention.

FIG. 6 shows a variation of the invention shown in FIGS. 4 and 5 where frame 46 is replaced with support sections 52. Support sections 52 are illustratively corner sections having legs 54 with first and second sections 56 at right angles to each other.

Figure 7:
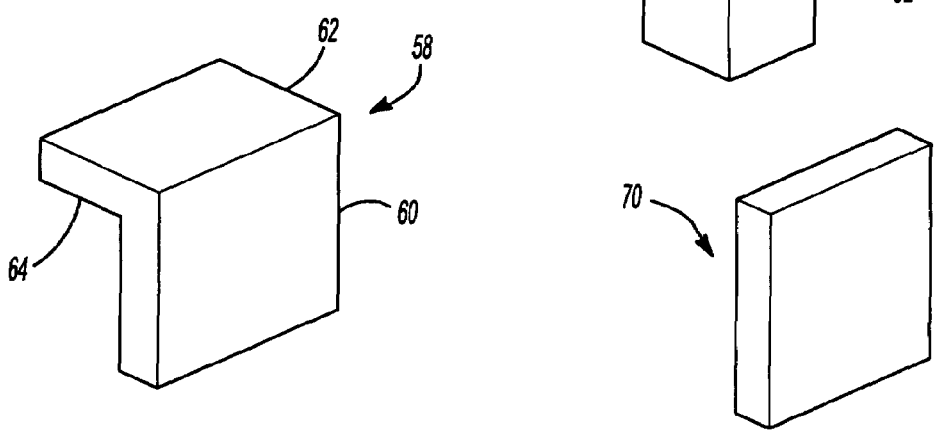
FIG. 7 is a perspective view of an alternative embodiment of support legs in accordance with the invention.

FIG. 7 shows a variation of the invention shown in FIG. 3 where one or more support sections 58 are used in lieu of or in addition to one or more support sections 36. Each support section 58 comprises an L-shaped section having a leg 60 and a top flange 62 and is secured to CGA integrated circuit package 10 in the same fashion as support sections 36. For example, each support section 58 is secured to CGA integrated circuit package 10 by adhesive 34 disposed between a bottom surface 64 of top flange 62 of support section 58 and top surface 13 of substrate 12 of CGA integrated circuit package 10. Support sections 58, however, can be secured anywhere around CGA integrated circuit package 10 and need not be secured to CGA integrated circuit package 10 at the corners of CGA integrated circuit package 10.

Figure 8:
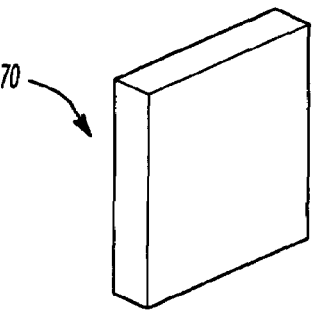
FIG. 8 is a perspective view of an alternative embodiment of support legs in accordance with the invention.

FIG. 8 shows a variation of the invention of FIG. 6 where one or more support sections 70 are used in lieu of or in addition to one or more support sections 52. Each support section 70 is generally rectangularly shaped and attached to CGA integrated circuit package in the same fashion as support section 58. Support sections 70, however, can be secured anywhere around CGA integrated circuit package 10 and need not be secured to CGA integrated circuit package 10 at the corners of CGA integrated circuit package 10.

It should be understood that the coefficient of thermal expansion (CTE) of the frame 26, frame 46, or support sections 36, 52, 58, 70 is important. In each instance, the CTE of the frame 26, frame 46, or support sections 36, 52, 58, 70, whichever are used, should preferably match the CTE of the supported CGA integrated circuit package 10 as closely as possible. The CTE of solder columns 18 is about 27 and that of ceramic is about 8 ppm/degree C. In the case of frame 26 and support sections 36 and 58 which are attached above substrate 12, stainless steel was found to have a suitable CTE.

Because of manufacturing tolerances, the height of CGA integrated circuit package 10 can vary by +/−4 mils. The adhesive attachment accommodates the tolerance variations assuring a tight support of CGA integrated circuit package 10 to circuit board 22. In this regard, frame 26, frame 46, or support sections 36, 52, 58, 70, whichever are used, are secured to CGA integrated circuit package 10 after CGA integrated circuit package 10 has been mounted to circuit board 22, such as by the above mentioned reflow soldering process.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. In a circuit board assembly having a circuit board and an integrated circuit package, the integrated circuit package having a substrate with an array of solder columns extending from a bottom surface of the substrate to the circuit board, a method of supporting the integrated circuit package against compressive force, comprising the step of affixing at least one support member to at least one of a side and a top of the substrate after the integrated circuit package has been mounted on the circuit board, the support member having at least a portion that extends from the substrate to the circuit board.

2. The method of claim 1 wherein step of affixing at least one support member to at least one of a side and a top of the substrate includes affixing the support member to the substrate so as to as to permit a cooling solution to be disposed on a top of the integrated circuit package in thermal contact therewith.

* * * * *

UNITED STATES PATENT AND TRADEMARK OFFICE
CERTIFICATE OF CORRECTION

| | | |
|---|---|---|
| PATENT NO. | : 7,434,309 B2 | Page 1 of 1 |
| APPLICATION NO. | : 10/652598 | |
| DATED | : October 14, 2008 | |
| INVENTOR(S) | : Jeffrey L. Deeney et al. | |

It is certified that error appears in the above-identified patent and that said Letters Patent is hereby corrected as shown below:

In column 1, line 11, delete "Nov. 11, 2001" and insert -- Nov. 16, 2001 --, therefor.

Signed and Sealed this

Twenty-fourth Day of March, 2009

JOHN DOLL
*Acting Director of the United States Patent and Trademark Office*